United States Patent
Turcotte

(10) Patent No.: US 10,147,840 B2
(45) Date of Patent: Dec. 4, 2018

(54) LIGHT EMITTING DIODE WITH LIGHT EMITTING LAYER CONTAINING NITROGEN AND PHOSPHORUS

(71) Applicant: Lumileds LLC, San Jose, CA (US)

(72) Inventor: Stephane Turcotte, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/195,004

(22) Filed: Jun. 28, 2016

(65) Prior Publication Data

US 2016/0308088 A1    Oct. 20, 2016

Related U.S. Application Data

(63) Continuation of application No. 14/411,926, filed as application No. PCT/IB2013/055161 on Jun. 24, 2013, now Pat. No. 9,406,835.

(60) Provisional application No. 61/668,053, filed on Jul. 5, 2012.

(51) Int. Cl.
| | |
|---|---|
| H01L 33/00 | (2010.01) |
| H01L 33/06 | (2010.01) |
| H01L 33/12 | (2010.01) |
| H01L 33/32 | (2010.01) |
| H01L 33/30 | (2010.01) |

(52) U.S. Cl.
CPC ...... *H01L 33/0025* (2013.01); *H01L 33/0062* (2013.01); *H01L 33/0075* (2013.01); *H01L 33/06* (2013.01); *H01L 33/12* (2013.01); *H01L 33/30* (2013.01); *H01L 33/32* (2013.01)

(58) Field of Classification Search
CPC ..... H01L 33/0025; H01L 33/06; H01L 33/12; H01L 33/30; H01L 33/32
See application file for complete search history.

(56) References Cited

U.S. PATENT DOCUMENTS

| | | |
|---|---|---|
| 4,916,708 A | 4/1990 | Hayakawa |
| 5,442,201 A | 8/1995 | Adomi et al. |
| 5,445,897 A | 8/1995 | Satoh et al. |
| 6,309,459 B1 | 10/2001 | Yuge |
| 7,095,051 B2 | 8/2006 | Nagahama et al. |
| 8,106,403 B2 | 1/2012 | McLaurin |

(Continued)

FOREIGN PATENT DOCUMENTS

| | | |
|---|---|---|
| CA | 2639902 A1 | 3/2010 |
| CN | 1528037 A | 9/2004 |

(Continued)

OTHER PUBLICATIONS

EPO as ISA, International Search Report mailed Oct. 30, 2013 from International Application No. PCT/IB2013/055161 filed Jun. 24, 2013.

(Continued)

*Primary Examiner* — Armando Rodriguez
(74) *Attorney, Agent, or Firm* — Volpe and Koenig, P.C.

(57) ABSTRACT

Embodiments of the invention include an n-type region, a p-type region, and a light emitting layer disposed between the n-type region and the p-type region. The light emitting layer is a III-V material comprising nitrogen and phosphorus. The device also includes a graded region disposed between the light emitting layer and one of the p-type region and the n-type region. The composition of materials in the graded region is graded.

17 Claims, 3 Drawing Sheets

(56) References Cited

U.S. PATENT DOCUMENTS

| | | | |
|---|---|---|---|
| 9,263,637 B2 | 2/2016 | Tan et al. | |
| 2002/0020341 A1 | 2/2002 | Marchand et al. | |
| 2004/0051107 A1* | 3/2004 | Nagahama | B82Y 20/00 257/79 |
| 2004/0099872 A1* | 5/2004 | McGill | B82Y 20/00 257/94 |
| 2005/0238075 A1 | 10/2005 | Jikutani et al. | |
| 2006/0011935 A1* | 1/2006 | Krames | H01L 33/02 257/99 |
| 2009/0108276 A1* | 4/2009 | Tu | H01L 33/12 257/94 |
| 2010/0308365 A1 | 12/2010 | Masuya et al. | |

FOREIGN PATENT DOCUMENTS

| | | |
|---|---|---|
| CN | 102341887 A | 2/2012 |
| JP | 06061525 A2 | 3/1994 |
| JP | 11017284 A2 | 1/1999 |
| JP | 2000183397 A2 | 6/2000 |

OTHER PUBLICATIONS

Kim et al., "MBE Growth of Highly Strained InGaPN/GaPN Quantum Well with High Indium Content", Journal of Crystal Growth, vol. 293, No. 2, Aug. 1, 2006, pp. 359-364.

McGill et al., "Yellow-green Emission for ETS-LEDs and Lasers Based on a Strained-InGaP Quantum Well Heterostructure Grown on a Transparent, Compositionally Graded AlInGaP Buffer", Materials Research Society Symposium Proceedings, Jan. 1, 2003, pp. 409-418.

Moon et al., "Dislocation-Free $InxGa_{1-x}P_{1-y}N_y/GaP_{1-z}N_z$ Double-Heterostructure Light Emitting Diode on Si Substrate", Japanese Journal of Applied Physics, vol. 44, No. 4A, Apr. 1, 2005, pp. 1752-1755.

Odnoblyudov et al., "Growth and Fabrication of InGaNP-Based Yellow-Red Light Emitting Diodes", Applied Physics Letters, vol. 89, No. 19, Nov. 7, 2006, pp. 191107-1-191107-3.

Odnoblyudov, "Gas-Source Molecular Beam Epitaxial Growth and Characterization of the (Al,In,Ga)NP/GaP Material System and Its Applications to Light-Emitting Diodes", UC San Diego Electronic Theses and Dissertations, Jan. 1, 2006, pp. 1-170.

Oduncuoglu et al., "Theoretical Study of Material Parameters of InGaNP/GaPN Quantum Structures", Optoelectronics and Advanced Materials—Rapid Communications, vol. 3, No. 3, Mar. 1, 2009, pp. 166-170.

Ohta, et al., "Effects of Tensile Strain on the Optical Properties of an AlGaP-Based Neighbouring Confinement Structure", Semiconductor Science and Technology, vol. 12, No. 7, Jul. 1, 1997, pp. 881-887.

Umeno et al., "Band Alignments of InGaPN/GaPN Quantum Well Structures on GaP and Si", Journal of Crystal Growth, vol. 301-302, Mar. 24, 2007, pp. 539-544.

TW Office Action, application 102124289, Nov. 8, 2016, 12 pps.

CN Office Action, Application 201380035827.X, dated Sep. 12, 2016, 19 pps.

* cited by examiner

LIGHT EMITTING DIODE WITH LIGHT EMITTING LAYER CONTAINING NITROGEN AND PHOSPHORUS

CROSS-REFERENCE TO RELATED APPLICATIONS

The present application is a continuation of U.S. patent application Ser. No. 14/411,926 filed on Dec. 30, 2014, titled "LIGHT EMITTING DIODE WITH LIGHT EMITTING LAYER CONTAINING NITROGEN AND PHOSPHORUS", which is a § 371 application of International Application No. PCT/IB2013/055161 filed on Jun. 24, 2013, which claims priority to U.S. Provisional Patent Application No. 61/668,053 filed on Jul. 5, 2012. U.S. patent application Ser. No. 14/411,926, International Application No. PCT/IB2013/055161, and U.S. Provisional Patent Application No. 61/668,053 are incorporated herein.

FIELD OF THE INVENTION

The present invention relates to a light emitting device including a III-V light emitting layer including both nitrogen and phosphorus.

BACKGROUND

Light emitting diodes (LEDs) are widely accepted as light sources in many applications that require low power consumption, small size, and high reliability. Diodes that emit light in the yellow-green to red regions of the visible spectrum contain active layers formed of an AlGaInP alloy, often grown on a GaAs substrate. Since GaAs is absorbing, it is typically removed and replaced by a transparent substrate.

U.S. 2009/0108276 states "[t]here are a number of known difficulties with currently used yellow-red AlInGaP-based light emitting devices. For example, they suffer from low internal quantum efficiency and poor temperature stability in the yellow-red range, which is usually attributed to poor electron confinement. In addition, the conventional procedure for removing the light absorbing GaAs substrate and wafer bonding a transparent substrate or reflective layer to the formed layer has a low yield and adds several relatively expensive processing steps, thus resulting in high costs."

FIG. 1 illustrates an LED structure described in paragraph 21 of U.S. 2009/0108276. In FIG. 1, "the LED structure may comprise a GaP substrate [10] over which is formed a GaP buffer layer [12], over which is formed an active region [14] comprising interleaved layers of a GaP barrier layer and a InmGa1-mNcP1-c layer where 0.001<c<0.05 and 0≤m≤0.4 active layer, over which is formed a GaP cap/contact layer [16]. In some embodiments of this specific structure, the GaP substrate [10] and GaP buffer layer [12] may be n-type and the cap/contact layer [16] may be p-type."

SUMMARY

It is an object of the invention to provide an efficient light emitting device that emits light with a peak wavelength between green and red.

Embodiments of the invention include an n-type region, a p-type region, and a light emitting layer disposed between the n-type region and the p-type region. The light emitting layer is a III-V material comprising nitrogen and phosphorus. The device also includes a graded region disposed between the light emitting layer and one of the p-type region and the n-type region. The composition in the graded region is graded.

A method according to embodiments of the invention includes growing a light emitting layer disposed between an n-type region and a p-type region and growing a graded region disposed between the light emitting layer and one of the p-type region and the n-type region. The light emitting layer is a III-V material including nitrogen and phosphorus. A composition in the graded region is graded or varied. As used herein, composition refers to the chemical composition of a layer, e.g. the relative amounts of constituent atoms that make up a semiconductor layer.

DETAILED DESCRIPTION

III-phosphide and III-nitride materials are often used to make LEDs that emit red or blue light. These materials cannot efficiently emit light having peak wavelengths in the range between 500 and 600 nm, due to, for example, poor material quality. InGaN and AlInGaP light emitting layers that emit light having a peak wavelength between 500 and 600 nm are often grown with fairly high levels of strain, resulting in defects that contribute to non-radiative recombination, which may reduce the efficiency of the LED.

In embodiments of the invention, dilute nitride InGaPN light emitting layers grown over GaP substrates may be grown nearly lattice matched (i.e. with little or no strain) and may emit light at the desired wavelengths. "Dilute nitride" semiconductors refer to III-V layers with nitrogen and at least one other group V atom. Examples include InGaAsN and InGaPN. The nitrogen content relative to the total group V content is generally no more than a few %. In dilute nitride layers, the band gap may change dramatically with a small change in nitrogen content, a property desirable to tune the target wavelength emission of these semiconductors. In GaPN alloys, the formation of subbands in the band structure transforms GaP, an indirect material, into a direct material suitable for light emitting devices such as LEDs. GaPN is in tension when grown on GaP and InGaP is in compression when grown on GaP. Accordingly, an InGaPN alloy may be grown lattice-matched or nearly lattice matched to a GaP substrate.

Figure 2:
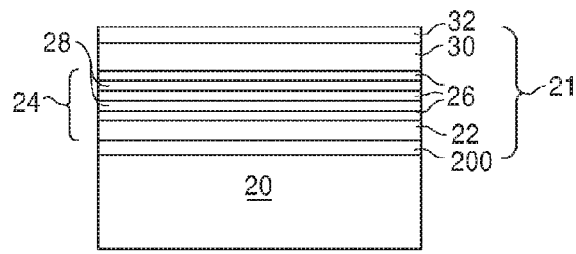
FIG. 2 illustrates an LED structure grown on a GaP substrate including at least one dilute nitride light emitting layer.

FIG. 2 illustrates a device including a dilute nitride light emitting layer, according to some embodiments. A light emitting or active region 24, described below, is disposed between a p-type region 200 and an n-type region 32. P-type region 200 is often GaP and may be doped with any suitable p-type dopant such as Zn. N-type region 32 is often GaP and may be doped with any suitable n-type dopant such as Si. N-type region 32 and p-type region 200 are often GaP because GaP is typically transparent to light emitted by the active region 24, which may have a peak wavelength that is red, red-orange, amber, yellow, or green. N-type region 32 and p-type region 200 may be any other suitable material, such as ternary materials including but not limited to InGaP and GaPN, and quaternary materials. N-type region 32 and p-type region 200 need not have the same composition, though they may.

In some embodiments, substrate 20, described below, is p-type GaP and p-type GaP region 200 may be omitted.

Substrate 20 is often GaP, which has a band gap of ~2.26 eV or ~549 nm, and is thus transparent to light at likely peak wavelengths emitted by the active region 24, i.e. red, red-orange, amber, yellow, or green light. A GaP substrate may be doped p-type with Zn or any other suitable dopant or doped n-type with Si or any other suitable dopant. Other substrates with an a-lattice constant close to the a-lattice constant of GaP may be used, or with an a-lattice constant that is close to the a-lattice constant of the InGaPN light emitting layers or other layers in the device. Examples of suitable substrates include Si, AlInP, ZnS, Ge, GaAs, and InP. Silicon which is inexpensive but absorbing of light at likely peak wavelengths emitted by the active region 24 may be used but is often removed. The growth substrate may be removed after growth of the above-described semiconductor structure, may be thinned after growth of the above-described semiconductor structure, or may remain part of the finished device. Absorbing substrates such as Si are often removed. In some embodiments, a semiconductor device structure 21 is grown on substrate 20 by any suitable epitaxial technique, such as metal-organic chemical vapor deposition, vapor-phase epitaxy, or molecular beam epitaxy. As used herein, "semiconductor device structure" may refer to semiconductor layers that are grown on the substrate, such as n-type layers, p-type layers, or layers in the active region.

In the device illustrated in FIG. 2, the substrate 20 may be p-type, thus any p-type layers are grown first, followed by active region 24, followed by any n-type layers, such as n-type region 32. In some embodiments, the substrate is n-type, such as n-GaP. On an n-type substrate, the semiconductor structure 21 illustrated in FIG. 2 may be grown in reverse, such that the n-type layers including n-type region 32 are grown first, followed by the active region 24, followed by the p-type layers including p-type region 200. Either structure, i.e. a structure with the p-type layers grown first or a structure with the n-type layers grown first, may be grown on an undoped substrate, such as Si.

In some embodiments, a graded region 22 is grown between p-type region 200 and active region 24, as illustrated in FIG. 2. In some embodiments, the composition of graded region 22 is graded. In some embodiments, the dopant concentration in graded region 22 is graded in addition to or instead of composition. Graded region 22 may be p-type or undoped. A p-type graded region 22 may be no more than 500 nm thick in some embodiments. An undoped graded region 22 may be no more than 100 nm thick in some embodiments.

As used herein, the term "graded" when describing the composition in a layer or layers in a device is meant to encompass any structure that achieves a change in composition in any manner other than a single step in composition. Each graded layer may be a stack of sublayers, each of the sublayers having a different composition than either sublayer adjacent to it. If the sublayers are of resolvable thickness, the graded layer is a step-graded layer. In some embodiments, the sublayers in a step-graded layer may have a thickness ranging from several tens of angstroms to several thousands of angstroms. In the limit where the thickness of individual sublayers approaches zero, the graded layer is a continuously-graded region. The sublayers making up each graded layer can be arranged to form a variety of profiles in composition versus thickness, including, but not limited to, linear grades, parabolic grades, and power-law grades. Also, graded layers or graded regions are not limited to a single grading profile, but may include portions with different grading profiles and one or more portions with substantially constant composition.

The composition in a semiconductor layer may be graded by varying one or more of the growth temperature, the flow rates of precursor materials during growth, and the relative flow rates of different precursor materials during growth.

The composition of graded region 22 may be graded from AlGaP or GaP in a portion of region 22 adjacent to p-type region 200 to AlGaP or AlP in a portion of region 22 adjacent to active region 24. For example, the composition of aluminum in an AlxGa1-xP graded region 22 in a portion closest to p-type region 200 may be x=0 in some embodiments, x≤0.05 in some embodiments, and x≤0.1 in some embodiments. The composition may be graded to an aluminum composition in a portion of AlxGa1-xP graded region 22 closest to active region 24 of x=1 in some embodiments, x≥0.95 in some embodiments, and x≥0.9 in some embodiments.

In some embodiments, graded region 22 is omitted and active region 24 is disposed in direct contact with p-type region 200.

A light emitting or active region 24 is grown on graded region 22 or on p-type region 200. In some embodiments, active region 24 includes a single thick or thin light emitting layer. In some embodiments, active region 24 includes multiple light emitting layers 26 separated by one or more barrier layers 28, as illustrated in FIG. 2. Light emitting layers 26 may be quantum wells in some embodiments. Though three light emitting layers 26 and two barrier layers 28 are illustrated in FIG. 2, active region 24 may include more or fewer light emitting layers and barrier layers. Barrier layers 28 separate light emitting layers 26. Barrier layers 28 may be, for example, GaP, AlGaP, AlInGaP, InGaPN, or any other suitable material with a larger band gap than light emitting layers 26.

Figure 7:
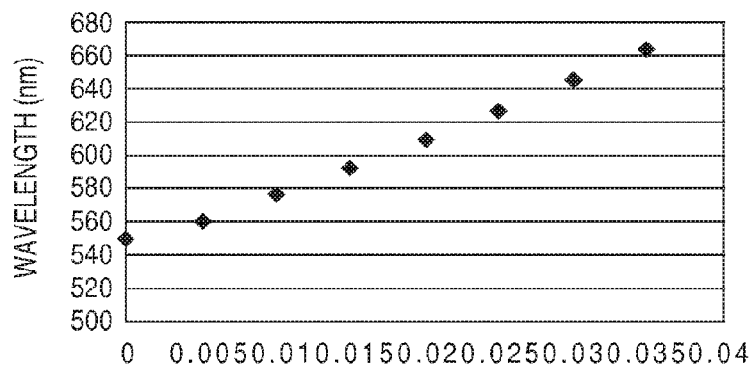
FIG. 7 is a plot of wavelength as a function of nitrogen composition for dilute nitride light emitting layers.

The composition of light emitting layers 26 may be selected such that the light emitting layers emit light have a peak wavelength in a range from green to yellow to red. In some embodiments, light emitting layers 26 are $In_xGa_{1-x}P_{1-y}N_y$. The subscript x refers to the In content and the subscript y refers to the N content. The composition x may be at least 0.01 in some embodiments and no more than 0.07 in some embodiments. The composition y may be at least 0.005 in some embodiments and no more than 0.035 in some embodiments. In order for an InGaPN light emitting layer to be lattice matched when grown on GaP, x=(2 to 2.4)y. In some embodiments, x is at least twice y. In some embodiments, x is no more than y multiplied by 2.5. In some embodiments, x is y multiplied by 2.4. In a device with AlGaP barriers and light emitting layers thicker than 10 nm, the light emitting layers may emit light having a green peak wavelength when y=0.005 (0.5%) and x=0.01, a yellow peak wavelength when y=0.015 (1.5%) and x=0.03, and a red peak wavelength when y=0.035 (3.5%) and x=0.07. FIG. 7 illustrates estimated wavelength as a function of N content (y) for several compositions of N in a device with AlGaP barriers and $In_xGa_{1-x}P_{1-y}N_y$ light emitting layers thicker than 10 nm, where x=2y. If the barriers are GaP, the compositions illustrated in FIG. 7 will result in approximately the same peak wavelengths as illustrated in FIG. 7. If the barriers are AlP, the curve illustrated in FIG. 7 may shift by at most 50 nm toward blue, meaning that light emitting layers that emit a peak wavelength that is blue (i.e. at about 510 nm) may be fabricated.

In some embodiments, InGaPN light emitting layers 26 are lattice matched to a GaP substrate 20, such that light emitting layers 26 are unstrained. In some embodiments, InGaPN light emitting layers 26 are a composition that is strained when grown on substrate 20. The composition of the light emitting layers may be selected such that the lattice constant of a theoretical relaxed material of the same composition as the light emitting layer differs from the lattice constant of substrate by less than 1% in some embodiments and less than 0.5% in some embodiments.

Light emitting layers 26 may be at least 2 nm thick in some embodiments, no more than 10 nm thick in some embodiments, at least 10 nm thick in some embodiments, and no more than 100 nm thick in some embodiments. Barrier layers 28 may be no more than 200 nm thick in some embodiments, no more than 100 nm thick in some embodiments, and at least 20 nm thick in some embodiments. For example, in an active region with thick light emitting layers (i.e. between 10 nm and 100 nm thick), the barrier layers may be less than 100 nm thick. In an active region with thin light emitting layers (i.e. between 3 nm and 10 nm thick), the barrier layers may be between 20 nm and 100 nm thick.

In some embodiments, a second graded region 30 is grown over active region 24, in direct contact with n-type region 32. The composition of graded region 30 may be graded from AlGaP in a portion of region 30 adjacent to active region 24 to GaP in a portion of region 30 adjacent to n-type region 32. For example, the composition in the portion of $Al_xGa_{1-x}P$ graded region 30 closest to active region 24 may be x=1 in some embodiments, x≥0.8 in some embodiments, and x≥0.9 in some embodiments. The composition in the portion of $Al_xGa_{1-x}P$ graded region 30 in a portion closest to n-type region 32 may be x=0 in some embodiments, x≤0.05 in some embodiments, and x≤0.1 in some embodiments. Graded region 30 may be undoped or doped with an n-type dopant such as Si. An n-type graded region 30 may be no more than 500 nm thick in some embodiments. An undoped graded region 30 may be no more than 100 nm thick in some embodiments.

In some embodiments, graded region 30 is omitted and n-type region 32 is disposed in direct contact with active region 24.

The use of one or both of p-type graded region 22 and n-type graded region 30 may minimize band discontinuities in the device, which may reduce the series resistance and the forward voltage of the device. In addition, graded regions 22 and/or 30 may reduce or eliminate waveguiding at the intersection of two materials with different indices of refraction, which may increase the amount of light extracted from the device.

Figure 8:
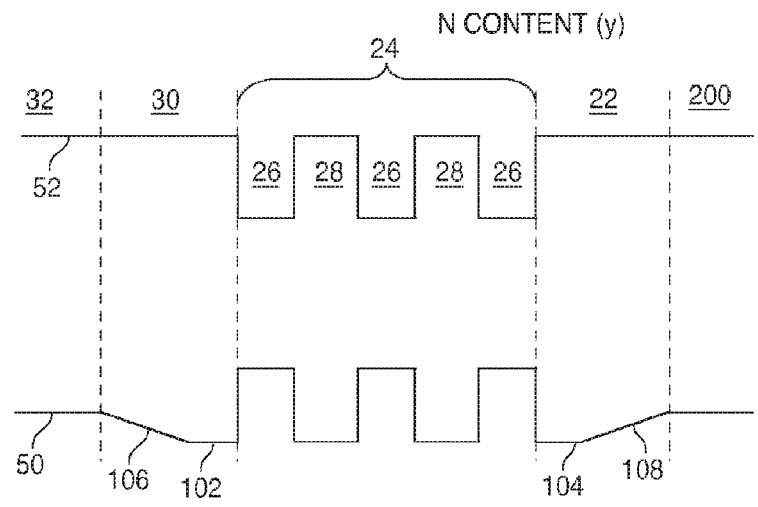
FIG. 8 is an energy band diagram as a function of position for an LED structure with thin light emitting layers.

FIG. 8 illustrates band energy as a function of position for a first example of a structure illustrated in FIG. 2. P-type region 200 and n-type region 32 have the largest band gaps in the structure. Light emitting layers 26 have the smallest band gaps in the structure. In active region 24, light emitting layers 26 are separated by barrier layer 28, which have a larger band gap than the light emitting layers 26. The valence band 50 and the conduction band 52 are flat (i.e. horizontal) in the areas corresponding to p-type region 200, light emitting layers 26, barrier layers 28, and n-type region 32, indicating that these areas have a constant band gap resulting from a constant composition. Though FIG. 8 illustrates the n-type region 32, the barrier layers 28, and the p-type region 200 as having the same band gap, in some embodiments they need not have the same band gap. The vertical parts of the valence band 50 and conduction band 52 indicate step changes in composition. Graded region 22 includes a region 104 of constant composition, which may be AlP. Between constant composition region 104 and p-type region 200 is a graded region 108. Graded region 30 includes a region 102 of constant composition, which may be AlP. Between constant composition region 102 and n-type region 32 is a graded region 106. In the graded regions 106 and 108, the valence band 50 is sloped, indicating that the band gap and therefore the composition are monotonically, linearly graded. The conduction band 52 is not sloped because in AlGaP layers, only the valence band may be affected by the Al content. In the device illustrated in FIG. 8, the p-type region 200 and n-type region 32 are GaP. The graded regions 106 and 108 are $Al_xGa_{1-x}P$, where x is graded from 0 in a portion of the graded region closest to GaP layer 32 or 200 to 1 in a portion of the graded region closest to constant composition regions 102 and 104. The regions 102 and 104 of constant composition may be, for example, at least twice the thickness of one of the barrier layers in the device. The light emitting layers 26 are InGaPN, with one or more compositions as described above in reference to FIG. 7, and the barrier layers are AlP. The light emitting layers are between 2 nm thick and 10 nm thick in some embodiments.

Figure 9:
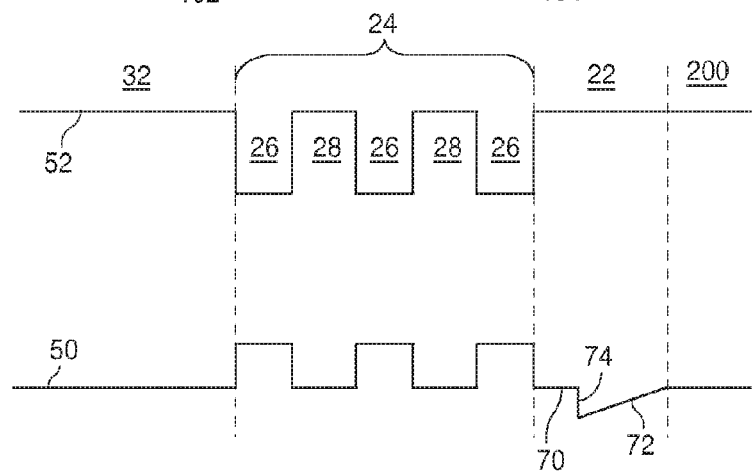
FIG. 9 is an energy band diagram as a function of position for an LED structure with thick light emitting layers.
Figure 10:
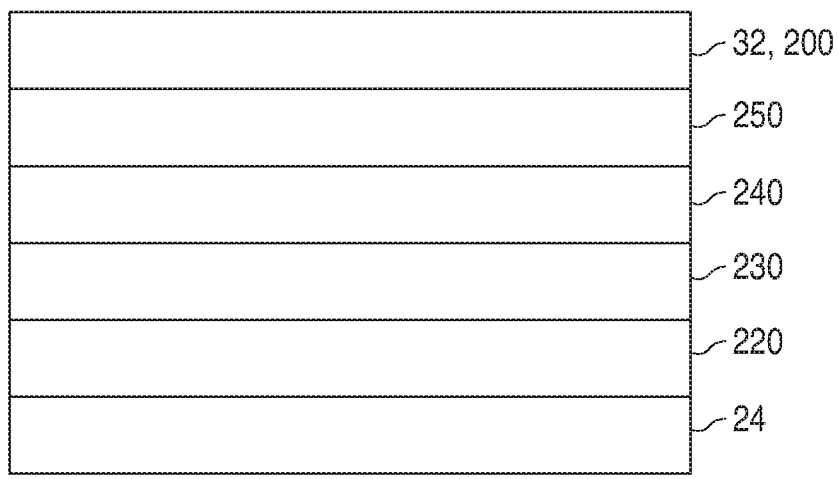
FIG. 10 illustrates a portion of a device including multiple portions of constant composition and/or graded composition.

FIG. 9 illustrates band energy as a function of position for a second example of a structure illustrated in FIG. 2. P-type region 200 and n-type region 32 have the largest band gaps in the structure. Light emitting layers 26 have the smallest band gaps in the structure. In active region 24, light emitting layers 26 are separated by barrier layer 28, which have a larger band gap than the light emitting layers 26. The valence band 50 and the conduction band 52 are flat (i.e. horizontal) in the areas corresponding to p-type region 200, light emitting layers 26, barrier layers 28, and n-type region 32, indicating that these areas have a constant band gap resulting from a constant composition. The vertical parts of the valence band 50 and conduction band 52 indicate step changes in composition. Graded region 30 is omitted. Graded region 22 includes a first portion 70 of constant composition (i.e. flat valence and conduction bands) and a second portion 72 where the composition is graded (i.e. sloped valence band 50), indicating that the band gap and therefore the composition in portion 72 are monotonically, linearly graded. In the graded portion 72, the material may be $Al_xGa_{1-x}P$, where x is graded from between 0.5 and 1 adjacent to GaP portion 70 to between 0.2 and 0 in a portion of the graded region closest to p-type region 200. A step change 74 indicates the transition between GaP in portion 70 and AlP at the left-most edge of graded portion 72. In the device illustrated in FIG. 9, the p-type region 200 and n-type region 32 are GaP. Constant composition portion 70 may be, for example, at least as thick as one of the barrier layers in the device. The light emitting layers 26 are InGaPN, with one or more compositions as described above in reference to FIG. 7, and the barrier layers are GaP. The light emitting layers are between 10 nm thick and 100 nm thick in some embodiments.

Any graded regions in the device may include multiple portions of constant composition and/or graded composition. A graded region with multiple portions of graded composition may have the same or different grading profiles in the portions of graded composition. For example, a graded region can include a portion of constant composition GaP adjacent to the light emitting region, followed by a portion of AlGaP that is graded from 0% Al to 100% Al, followed by a portion of constant composition AlP having a thickness of less than 110 nm, followed by a portion of AlGaP graded from 100% Al to 0% Al adjacent to the n-type or p-type GaP layer 32 or 200, depending on the location of the graded region in the device. In another example, a graded region includes a portion of constant composition GaP adjacent to the light emitting region, followed by a graded portion of AlGaP that is graded from 0% Al (GaP) to between 50 and 100% Al, followed by a portion of constant composition AlGaP that is between 50% and 100% Al, followed by graded portion of AlGaP that is graded from the Al composition in the constant composition portion to 0% (GaP) adjacent to the n-type or p-type GaP layer 32 or 200, depending on the location of the graded region in the device.

FIGS. 3, 4, 5, and 6 illustrate finished LEDs, including any of the semiconductor structures described above and metal contacts formed on the n-type region 32 and the p-type substrate 20 or p-type region 200. The metal contacts are used to forward bias the device. In the devices illustrated in FIGS. 3 and 4, the growth substrate 20 remains part of the device. In the devices illustrated in FIGS. 5 and 6, the growth substrate is removed from the semiconductor structure.

Figure 1:
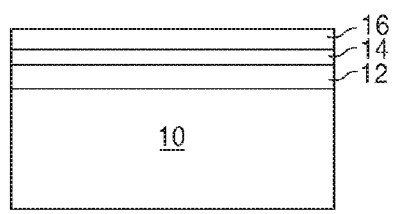
FIG. 1 illustrates an LED structure formed on a GaP substrate.
Figure 3:
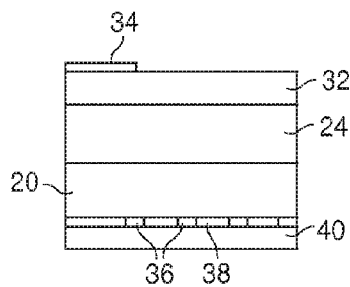
FIGS. 3 and 4 illustrate two examples of the arrangement of metal contacts on an LED structure with at least one dilute nitride light emitting layer.
Figure 4:
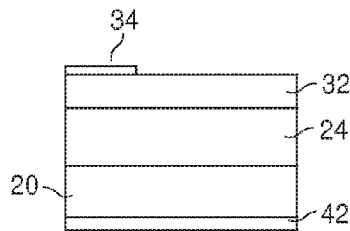

In the structures illustrated in FIGS. 3 and 4, an n-contact 34 is formed on a portion of the n-type region 32. N-contact 34 may be, for example, any suitable metal including Ge, Au, and Ni. In some embodiments, n-contact 34 is a multi-layer contact. For example, n-contact 34 may include a Ge layer in direct contact with n-type region 32, followed by Au, Ni, and Au layers.

In the structure illustrated in FIG. 3, conductive dots 36 make electrical contact to p-type GaP substrate 20. Dots 36 may be, for example, AuZn. Dots 36 may be embedded in a mirror 38. Mirror 38 may be any suitable reflective material including, for example, a layer of SiO2 in direct contact with substrate 20, and a layer of Ag formed over the SiO2. A second mirror 40 is formed such that conductive dots 36 are positioned between mirror 40 and substrate 20. Mirror 40 may be a conductive material such as a metal, Ag, Al, or any other suitable material. In the structure illustrated in FIG. 3, the p-type substrate 20 is thick enough to efficiently spread the current laterally over a significant distance on the p-side of active region 24. P-doped GaP substrates (doped with Zn) are available in thicknesses of about 200 to 400 µm. Current can spread about 0.2 mm in a p-GaP substrate 300 µm thick. In some embodiments, conductive dots 36 are placed no further apart than the current spreading distance of the substrate 20. Conductive dots 36 may be at least 10 µm wide in some embodiments and no more than 100 µm wide in some embodiments. Conductive dots 36 may be spaced at least 100 µm apart in some embodiments, at least 200 µm apart in some embodiments, and no more than 500 µm apart in some embodiments.

In the structure illustrated in FIG. 4, a full sheet contact 42 which is reflective is formed in direct contact with p-type GaP substrate 20. Sheet contact 42 may be, for example, AuZn or any other highly reflective layer that forms an ohmic contact with GaP.

Figure 5:
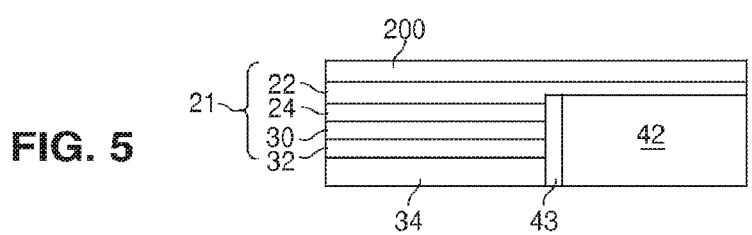
FIG. 5 illustrates a flip chip LED structure.
Figure 6:
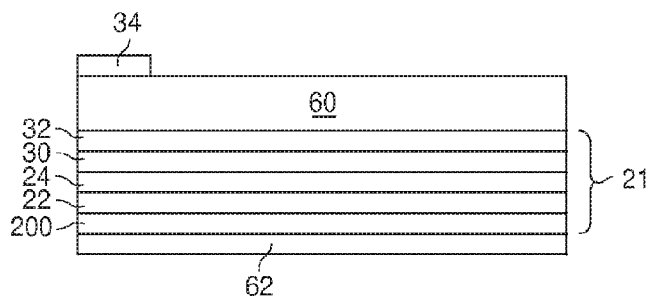
FIG. 6 illustrates an LED structure from which the growth substrate has been removed.

FIGS. 5 and 6 illustrate devices where the growth substrate 20 is removed.

FIG. 5 is a flip chip device. An n-contact 34 is formed on n-type region 32, then a portion of the n-contact 34, n-type region 32, graded region 30, and active region 24 are etched away to form a mesa exposing a portion of graded region 22, which may be p-type, or p-type region 200, on which a p-type contact 42 is formed. A gap 43, which may be filled with a solid material such as a dielectric, electrically isolates n- and p-contacts 34 and 42. The device may be attached to a mount (not shown) to support the semiconductor structure 21, or n- and p-contacts may be formed to support the semiconductor structure 21. The growth substrate is then removed, revealing a surface of p-type region 200. The growth substrate may be removed by any suitable technique, including wet or dry etching, mechanical techniques such as grinding, or laser melting. N- and p-contacts 34 and 42 may be reflective, and the device mounted such that a majority of light is extracted through the top surface of p-type region 200, in the orientation illustrated in FIG. 5.

In FIG. 6, the semiconductor structure is bonded to a host substrate 60 through the top surface of n-type region 32 of semiconductor structure 21. One or more optional bonding layers, not shown in FIG. 6, may be disposed between host substrate 60 and semiconductor structure 21. Host substrate 60 mechanically supports the semiconductor structure 21 during removal of the growth substrate 20, not shown in FIG. 6. Removing the growth substrate exposes a bottom surface of p-type region 200, on which a p-contact 62 is formed. P-contact 62 may be any suitable contact, including the contacts described above in reference to FIGS. 3 and 4. An n-contact 34 is formed on host substrate 60. In the device illustrated in FIG. 6, host substrate 60 must be conductive. Examples of suitable host substrate materials include n-type GaP. Host substrate 60 may be transparent and n-contact 34 limited in extent so a majority of light is extracted through the top surface of host substrate 60. Alternatively, host substrate 60 may be reflective and the p-contact 62 may be transparent or limited in extent so a majority of light is extracted through p-contact 62 and/or p-type region 200.

In some embodiments, host substrate 60 is not conductive and the n- and p-contacts are formed in a flip chip formation, as illustrated in FIG. 5. Examples of suitable host substrate materials include sapphire and glass.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:
1. A device comprising:
a substrate;
a p-type region disposed on the substrate;
an n-type region;
a III-V material light emitting layer, that comprises nitrogen and phosphorus, disposed between the n-type region and the p-type region;
a graded region disposed between the light emitting layer and the n-type region, the graded region including a composition that is graded;

a first contact comprising a mirror and conductive dots embedded in the mirror, the first contact disposed on the substrate; and a second contact disposed on the n-type region.

2. The device of claim 1 including the light emitting layer being $InGaN_xP_{1-x}$, where $0<X\leq0.03$.

3. The device of claim 1 including the light emitting layer has a composition that when forward biased emits light having a peak wavelength in a range of green to red.

4. The device of claim 1 including the graded region being a first graded region, the device further comprising a second graded region disposed between the light emitting layer and the p-type region, the second graded region including a composition that is graded.

5. The device of claim 1 including the composition in the graded region being graded from a composition of GaP in a portion of the graded region closest to the n-type region to a composition of AlGaP in a portion of the graded region closest to the light emitting layer.

6. The device of claim 1 including the n-type region and the p-type region being GaP.

7. The device of claim 1 including the substrate being p-type GaP.

8. The device of claim 1 including the first contact that comprises a reflective metal.

9. The device of claim 8 including the reflective metal being a full sheet of AuZn.

10. The device of claim 1 including:

the mirror that comprises a layer of $SiO_2$ in direct contact with the substrate and a layer of Ag disposed on the layer of $SiO_2$; and the conductive dots being AuZn.

11. The device of claim 1 further comprising a second mirror, the conductive dots being disposed between the second mirror and the substrate.

12. The device of claim 11 including the second mirror that is one of metal, Ag, and Al.

13. A device comprising:

a p-type region;

an n-type region;

a III-V material light emitting layer, that comprises nitrogen and phosphorus, disposed between the n-type region and the p-type region;

a p-type graded region disposed between the light emitting layer and the p-type region, including a composition in the graded region that is graded;

a first contact disposed in electrical contact with the p-type region and the first contact disposed in contact with the p-type graded region; and a second contact disposed on the n-type region, the first and second contacts are formed on a same side of the device.

14. The device of claim 13 further comprising an etched mesa that exposes a surface of a p-type layer on which the first contact is formed.

15. The device of claim 13 including the light emitting layer being $InGaN_xP_{1-x}$, where $0<X\leq0.03$.

16. The device of claim 13 including the light emitting layer that has a composition that when forward biased emits light having a peak wavelength in a range of green to red.

17. A device comprising:

a substrate;

a p-type region disposed on the substrate;

an n-type region;

a III-V material light emitting layer, that comprises nitrogen and phosphorus, disposed between the n-type region and the p-type region;

a graded region disposed between the light emitting layer and the n-type region, the graded region including a composition that is graded;

a first contact comprising a reflective metal, the first contact disposed on the substrate; and a second contact disposed on the n-type region.

* * * * *